United States Patent
Shozo

(10) Patent No.: US 7,576,594 B2
(45) Date of Patent: Aug. 18, 2009

(54) METHOD AND DEVICE FOR REDUCING INFLUENCE OF EARLY EFFECT

(75) Inventor: Nitta Shozo, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 204 days.

(21) Appl. No.: 10/270,746

(22) Filed: Oct. 15, 2002

(65) Prior Publication Data
US 2003/0094994 A1 May 22, 2003

(30) Foreign Application Priority Data
Oct. 16, 2001 (JP) .............................. 2001-318301

(51) Int. Cl.
*G05F 1/10* (2006.01)
(52) U.S. Cl. ...................... 327/538; 327/543
(58) Field of Classification Search ................. 327/419, 327/427, 378, 434, 478, 538, 540, 541, 542, 327/543
See application file for complete search history.

(56) References Cited

U.S. PATENT DOCUMENTS

| | | | | |
|---|---|---|---|---|
| 4,412,186 A | * | 10/1983 | Nagano | 330/288 |
| 4,462,005 A | * | 7/1984 | Kusakabe et al. | 330/288 |
| 4,629,973 A | * | 12/1986 | Voorman | 323/316 |
| 4,681,441 A | * | 7/1987 | Uchidoi et al. | 356/222 |
| 4,714,845 A | * | 12/1987 | Devecchi et al. | 327/73 |
| 5,045,808 A | * | 9/1991 | Taylor | 330/277 |
| 5,083,051 A | * | 1/1992 | Whatley et al. | 327/310 |
| 5,140,279 A | * | 8/1992 | Scott, III | 330/156 |
| 5,198,782 A | * | 3/1993 | Scott | 330/277 |
| 5,313,089 A | * | 5/1994 | Jones, Jr. | 257/295 |
| 5,365,199 A | * | 11/1994 | Brooks | 330/291 |
| 5,469,104 A | * | 11/1995 | Smith et al. | 327/491 |
| 5,654,673 A | * | 8/1997 | Shinohara | 330/297 |
| 5,774,021 A | * | 6/1998 | Szepesi et al. | 330/257 |
| 6,018,269 A | * | 1/2000 | Viswanathan | 330/254 |
| 6,054,901 A | * | 4/2000 | Nainar et al. | 330/292 |
| 6,177,827 B1 | * | 1/2001 | Ota | 327/536 |
| 6,246,290 B1 | * | 6/2001 | Morrish et al. | 330/311 |

(Continued)

OTHER PUBLICATIONS

Viswanathan, T.L., CMOS Transconductance Element, proceedings of the IEEE, vol. 74, No. 1, Jan. 1986, pp. 222-224.*

*Primary Examiner*—Lincoln Donovan
*Assistant Examiner*—Thomas J Hiltunen
(74) *Attorney, Agent, or Firm*—John J. Patti; Wade J. Brady, III; Frederick J. Telecky, Jr.

(57) ABSTRACT

A method is provided for improving the performance of a circuit containing a three-terminal device. In the operation of a circuit containing three-terminal device 10, the influence of the Early effect pertaining to the three-terminal device of a FET is reduced. In order to reduce the influence, control unit 30 is set for reducing the Early effect component caused by a three-terminal device. As a result, by controlling the potential of the second terminal (such as drain) of the device as a response to a first signal pertaining to the input signal received by the first terminal (such as gate) of the device, it is possible for the potential difference between the second terminal (drain) and the third terminal (such as source) of the device to be essentially constant.

5 Claims, 5 Drawing Sheets

U.S. PATENT DOCUMENTS

| | | | |
|---|---|---|---|
| 6,396,249 B1 * | 5/2002 | Itakura et al. | 323/273 |
| 6,407,620 B1 * | 6/2002 | Hirayama | 327/538 |
| 6,426,669 B1 * | 7/2002 | Friedman et al. | 327/539 |
| 6,545,513 B2 * | 4/2003 | Tsuchida et al. | 327/108 |
| 6,573,784 B2 * | 6/2003 | Gower et al. | 330/9 |
| 6,653,891 B1 * | 11/2003 | Hazucha | 327/540 |
| 6,654,066 B1 * | 11/2003 | Vu et al. | 348/572 |
| 6,661,253 B1 * | 12/2003 | Lee et al. | 326/41 |
| 6,727,729 B2 * | 4/2004 | Brooks et al. | 326/68 |
| 6,937,104 B1 * | 8/2005 | Varadarajan et al. | 330/311 |
| 6,977,490 B1 * | 12/2005 | Zhang et al. | 323/280 |
| 7,019,580 B1 * | 3/2006 | Michalski | 327/427 |
| 7,385,426 B1 * | 6/2008 | Wan et al. | 326/115 |
| 2001/0043115 A1 * | 11/2001 | Barou et al. | 327/540 |
| 2002/0093316 A1 * | 7/2002 | Fahrenbruch | 323/273 |
| 2002/0175761 A1 * | 11/2002 | Bach et al. | 330/277 |
| 2005/0057189 A1 * | 3/2005 | Kimura | 315/291 |
| 2007/0103207 A1 * | 5/2007 | Huang | 327/108 |
| 2008/0122519 A1 * | 5/2008 | Nowak | 327/534 |
| 2008/0129326 A1 * | 6/2008 | Agarwal et al. | 324/769 |

* cited by examiner

OPERATIONAL AMPLIFIER

METHOD AND DEVICE FOR REDUCING INFLUENCE OF EARLY EFFECT

FIELD OF THE INVENTION

This invention pertains to a method for using a three-terminal device, and a circuit for applying said method. Also, this invention pertains to a method and circuit for reducing the influence of the Early effect of a three-terminal device, and a buffer or another circuit that uses said method or circuit.

BACKGROUND OF THE INVENTION

In the prior art, closed loop buffers using operational amplifiers have been used for high-precision buffering. Also, open loop buffers represented by an emitter follower are also in use.

However, for a closed loop buffer using an operational amplifier, because it has a feedback loop, it is hard to realize high speed of operation. Also, for such closed loop buffer, even when a bipolar processor is used, a commercially available general-purpose IC can only realize a settling time of about tens of ns, and it is hard to realize a settling time one order of magnitude shorter, that is, several ns. Also, in a closed loop buffer using a CMOS process, there is no way to realize a settling time of several ns. More specifically, an example of the general structure of a closed loop buffer using an operational amplifier as shown in FIG. 1 will be considered. A signal is input to the non-inverted input terminal of the operational amplifier, and the signal output is connected directly to the inverted input terminal to form a feedback with a feedback ratio of unity. In this way, a buffer with gain of 1-fold (voltage follower) is formed. In the operation of the operational amplifier, even when there is certain offset between the non-inverted input and the inverted input voltage, they are nearly equal to each other. Consequently, the output can completely follow the input, and the precision is rather high with respect to gain error, harmonic distortion, etc. On the other hand, usually, an operational amplifier consists of several or more transistors, and the same number of transistors are contained in the signal path. Also, since it is used with feedback applied on it, if no particularly special process is used, there is no way to expect a high speed of operation. In addition, if the DC gain of the amplifier is raised or the magnitude of the input differential transistor is increased to reduce the offset, the operation speed further falls. Even when an up-to-date CMOS process is used, it is still extremely hard to realize a settling time of a few ns for 12-bit operation.

On the other hand, for an emitter follower as an open loop buffer, although the speed is high, gain error and harmonic distortion are significant, so that the precision is poor. This will be considered in more detail. FIG. 2 is a diagram illustrating the general constitution of a source follower using NMOS transistor M1. The gate of M1 is for signal input; the drain is connected to the power source, and the source is terminated to ground via a constant-current source. The source is for signal output. Also, the back gate is hung on the source for improvement of precision. In this constitution, the input impedance is nearly infinitely high, and the output impedance is the reciprocal of $g_m$ (transconductance) of M1, and it is rather small. Also, the output sink current is up to I, the magnitude of the constant-current source, and the maximum level of the output source current is much larger than this. Consequently, a source follower is used as a buffer (buffer) with a high driving power. The input signal level and the output signal level divide the gate-source voltage (Vgs) of M1. However, since Vgs is normally nearly constant, it simply becomes a DC shift, and the output completely follows the input. Consequently, it becomes a buffer with a 1-fold gain. The DC shift itself is constantly offset, and there is no significant problem. In particular, there is no problem at all for application with AC coupling, etc.

Now, the case when this type of source follower drives a switched capacitor circuit or another capacitive load will be considered. In this case, because the output current is zero when the output voltage is in a completely settled state, current I of the constant-current source all flows through transistor M1. In this case, current I becomes a function of gate-source voltage (Vgs), drain-source voltage (Vds) and body (back gate)-source voltage (Vbs) of M1. That is, current I can be represented by Equation 1.

[Mathematical Formula 1]

$$I = F(Vgs, Vds, Vbs) \quad (1)$$

Assuming that this current I is constant, in order for Vgs to be constant, one may just set Vds constant and Vbs constant. Now, since the back gate is hung on the source, Vbs=0 all the time. However, since the drain is hung on the power source (constant), the output signal (voltage on the source) varies following the input signal, and Vds varies nearly proportional to it. Sensitivity of current I with respect to Vds is not so high, and I can be determined nearly with Vgs. However, if variation in the input signal is high, the influence of variation in Vds cannot be ignored. That is, in the aforementioned relationship equation, when I is constant, Vds varies following the input signal, so that there is certain variation in Vgs, too. Consequently, gain error takes place. Also, because the signal dependence of Vgs is not completely linear, harmonic distortion takes place in the output. In a circuit with the constitution shown in FIG. 2, there is only one transistor contained in the signal path. Consequently, a preferable high-speed operation is fundamental. However, as aforementioned, there is a problem with respect to precision.

The above discussion applies in the same way on a source follower using a PMOS transistor shown in FIG. 3. In addition, it also applies on emitter followers using NPN, PNP, and other bipolar transistors.

Consequently, the objective of this invention is to provide a method for using a three-terminal device characterized by the fact that it can perform operation of a circuit containing a three-terminal device with a prescribed target, that is, at high speed and with high precision, as well as a type of circuit for using this method.

Another objective of this invention is to provide a method for reducing the Early effect component characterized by the fact that it can perform operation of a circuit containing a three-terminal device with a prescribed target, that is, at high speed and with high precision, as well as a type of circuit for using said method.

Yet another objective of this invention is to provide a method and circuit of a signal buffer using the Early effect component reducing method.

In addition, yet another objective of this invention is to provide various types of signal processing circuits using said buffer circuit.

SUMMARY OF INVENTION

In order to realize the aforementioned objectives, the method using a three-terminal device of this invention is characterized by the fact that it can reduce the influence of the Early effect pertaining to said three-terminal device in the operation of a circuit containing the three-terminal device.

In this invention, reduction of the Early effect is performed for increasing the operation speed and precision of operation of said circuit.

Also, it is possible to use the three-terminal device with all of the first, second and third terminals not grounded. In addition, the three-terminal device has a first terminal and second terminal acting as input terminals and a third terminal acting as output terminal, and the three-terminal device is used with the second terminal not grounded, or with the first terminal and third terminal also not grounded. As a result, the three-terminal device can operate in a non-grounded state. In this case, the first potential difference between the second terminal and third terminal is kept essentially constant irrespective of variation in the input signal.

Also, the Early effect component reducing method of this invention is characterized by the following facts: the method is for reducing the Early effect component in the output signal of a three-terminal device, which has a first terminal and second terminal acting as input terminals and a third terminal acting as output terminal, and which generates an output signal to the third terminal as a response to the input signal input to the first terminal; by controlling the potential of the second terminal of the device as a response to the first terminal pertaining to the input signal received in the first terminal, the first potential difference (Vds) between the second terminal and the third terminal of the device is essentially kept constant.

According to this invention, the second potential difference (Vgs) between the first terminal and the third terminal has a relationship of first function ($f_1$) with respect to the first potential difference (Vds) between the second terminal and the third terminal.

For the control, since the first signal is received by an input terminal and a second signal is generated at the output terminal, the first potential difference (Vds) has a relationship of second function ($f_2$) with respect to the second potential difference (Vgs). In this case, the second function can be a linear function using the second potential difference (Vgs) as a variable, or a constant function using the second potential difference (Vgs) as a variable, or a combination of the aforementioned linear function and constant function.

Also, the signal buffer method, in which the signal is buffered using a buffer circuit containing a three-terminal device is characterized by the fact that the Early effect component pertaining to the three-terminal device is reduced in the operation of the buffer circuit.

According to this invention, the three-terminal device has a first terminal and second terminal acting as input terminals and a third terminal acting as output terminal, and an output signal is generated in the third terminal as a response to the input signal input to the first terminal; the operation for reducing the Early effect component includes the following steps: A) a step in which the input signal is received with the first terminal of the three-terminal device, B) a step in which a first signal pertaining to the, input signal is generated, C) a step in which the potential of the second terminal of the device is controlled as a response to the first signal, so that the first potential difference (Vds) between the second terminal and the third terminal of the device is kept essentially constant, and D) a step in which the output signal as buffered the input signal received with the first terminal is generated from the third terminal of the three-terminal device.

Also, the Early effect component reducing circuit of this invention is characterized by the following facts: the Early effect component reducing circuit is for reducing the component due to the Early effect in the output signal of a three-terminal device, which has a first terminal and second terminal acting as input terminals and a third terminal acting as output terminal and which generates an output signal on the third terminal as a response to the input signal input to the first terminal; it has a control means that receives the first signal pertaining to the input signal and controls the potential of the second terminal of the device as a response to the first signal; in this way, the first potential difference (Vds) between the second terminal and the third terminal of the device is kept essentially constant so that the Early effect component is reduced.

According to this invention, second potential difference (Vgs) between the first terminal and the third terminal has the relationship of a first function ($f_1$) with respect to the first potential difference (Vds) between the second terminal and the third terminal.

For the control means, by receiving the first signal with an input terminal and generating a second signal on an output terminal, the first potential difference (Vds) has the relationship of a second function ($f_2$) with respect to the second potential difference (Vgs).

In addition, the second function may be a linear function with the second potential difference (Vgs) as variable, or a constant function with the second potential difference (Vgs) as variable, or a combination of the linear function and the constant function.

Also, the buffer circuit of this invention is characterized by the fact that it has the Early effect component reducing circuit. This invention is also characterized by the fact that an analog circuit or mixed signal circuit contains the buffer circuit.

DESCRIPTION OF EMBODIMENTS

In the following, this invention will be explained in detail with reference to figures.

Figure 4:
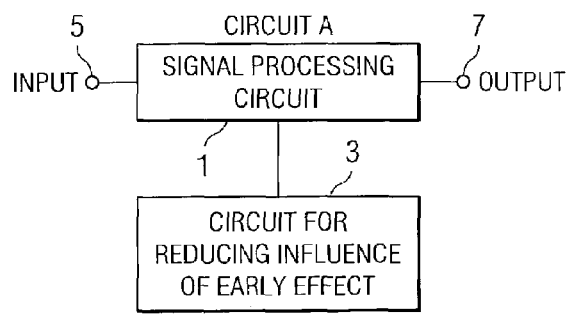
FIG. 4 is a block diagram illustrating circuit A composed of any signal processing circuit 1 containing a three-terminal device and Early effect component reducing circuit 3 for improving the signal processing circuit according to this invention.

First of all, the basic concept of use of a three-terminal device in this invention will be considered with reference to FIG. 4. As shown in FIG. 4, circuit A includes any signal processing circuit 1 containing a three-terminal device (not shown in the figure), and Early effect component reducing circuit 3 for improving performance of said signal processing circuit. This signal processing circuit includes a buffer circuit, analog circuit or mixed signal circuit containing said buffer circuit, other processing circuits, etc. This signal processing circuit 1 has an input signal received with its input terminal 5 and generates an output signal at its output terminal 7 after processing of the input signal. According to this invention, in order to increase the signal processing speed, precision, and other properties in signal processing circuit 1, Early effect component integral reducing circuit 3 connected to said signal processing circuit 1 operates such that the influence of the Early effect of said three-terminal device is reduced.

Figure 7:
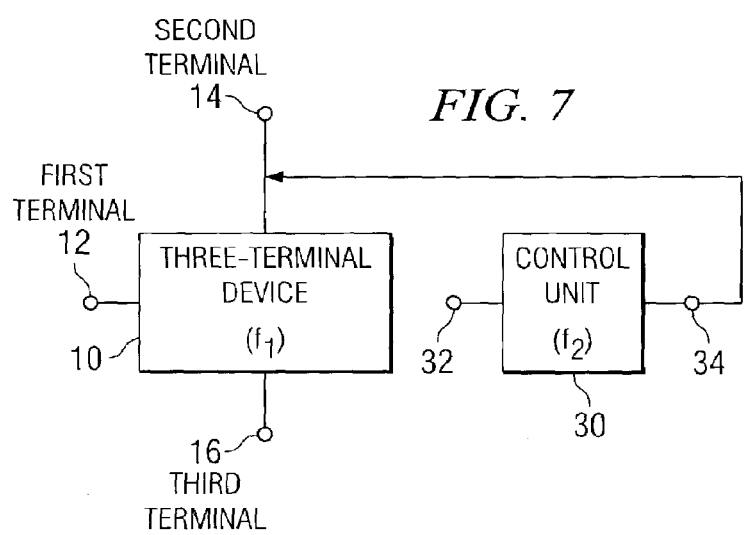
FIG. 7 is a diagram illustrating in detail the Early effect component reducing circuit for reducing the influence of the Early effect of the three-terminal device contained in the signal processing circuit shown in FIG. 4.

FIG. 7 is a diagram illustrating in detail a circuit for reducing the influence of the Early effect of a three-terminal device. As shown in FIG. 7, control unit 30 is set as an example of Early effect influence reducing circuit 3 with respect to three-terminal device 10. Three-terminal device 10 is a FET having a gate, drain, and source, or a bipolar transistor having a base, collector, and emitter. Here, the gate or base functions as first terminal 12, the drain or collector functions as second terminal 14, and the source or emitter functions as third terminal 16.

In the following, the Early effect of field effect transistor FET as a three-terminal device will be considered with reference to FIG. 5. Drain current $I_D$ of the FET can be represented by Equation 2 in the saturated state.

[Mathematical Formula 2]

$$I_D = \frac{1}{2}\mu C_{OX}\frac{W}{L}(V_{gs} - V_T)^2 \times (1 + \lambda V_{ds}) \quad (2)$$

where, $\mu$ represents mobility, $C_{ox}$ represents the unit capacitance between gate and body, W represents channel width, L represents channel length, Vgs represents gate-source voltage, $V_T$ represents threshold voltage, $1/\lambda$ represents Early voltage, Vds represents drain-source voltage.

Figure 5:
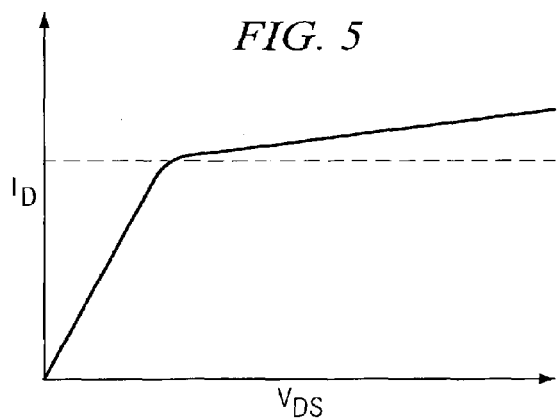
FIG. 5 is a graph illustrating the relationship between drain current $I_D$ and drain-source voltage Vds in field effect transistor FET.

As shown in FIG. 5, when Vds is in a saturated state higher than a certain level, drain current $I_D$ is nearly constant as indicated by the broken line. However, due to the Early effect, it increases a little along with increase in Vds as indicated by the solid line. The Early effect component in the drain current is due to $\lambda$ Vds in Equation 2. As can be seen from this equation, the Early effect component is proportional to Vds. In order to reduce the Early effect component in the three-terminal device, control unit 30 has input terminal 32 connected for receiving the first signal as related to the input signal received with the first terminal of the three-terminal device. Its output terminal 34 controls the potential of second terminal 14 of three-terminal device 10 as a response to the first signal. As a result, control unit 30 keeps the first potential difference (such as Vds of the FET) between second terminal 14 and third terminal 16 of three-terminal device 10 essentially constant, and, as can be seen from Equation 2, the Early effect component is reduced.

Figure 6:
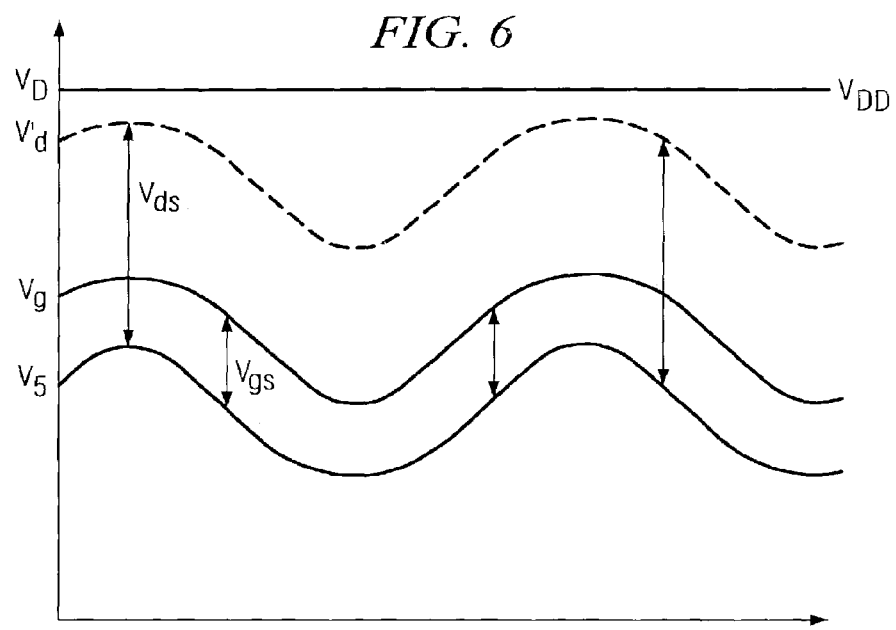
FIG. 6 is a waveform diagram illustrating the waveforms of voltages of the various portions, including gate, drain, and source, with a FET as an example of a three-terminal device in a source follower.

The operation of three-terminal device 10 and control unit 30 will be considered in more detail with reference to FIG. 6. In this case, three-terminal device 10 is taken as a FET for explanation. FIG. 6 illustrates the various terminal voltages of a FET when it is connected for use as a source follower in FIG. 2. When gate voltage Vg, which is the input signal, has a waveform including a sinusoidal wave overlapped on a DC voltage, source voltage Vs is lower than gate voltage Vg by gate-source voltage Vgs, yet it has the same waveform as gate voltage Vg. Drain Vd is $V_D$ equal to power source voltage $V_{DD}$ in the conventional source follower circuit shown in FIG. 2.

However, according to this invention, as indicated by the broken line, the waveform follows the waveform of gate voltage Vg, and the drain-source voltage becomes constant. In other words, in the source follower of the prior art, the drain terminal is grounded. In this invention, the drain terminal is not grounded for use, and, in the source follower constitution, none of the terminals of gate, drain and source are grounded for use. That is, this invention is characterized by the fact that a three-terminal device is used in a non-grounded state. As a result, by controlling the drain voltage, the drain-source voltage is kept constant. Since the drain-source voltage is kept constant, it is possible to reduce the influence of the Early effect, that is, the Early effect component in the drain current. Also, as shown in FIG. 6, in the prior art, there is a significant variation in the drain-source voltage depending on variation in gate voltage Vg.

In the following, a specific control method of control unit 30 will be considered with reference to the source follower in the prior art shown in FIG. 2. According to this invention, Vds in said Equation (1) is kept almost constant independent of gate voltage Vg, the input signal. As a result, the drain of transistor M1 of the source follower varies following the input level. More specifically, as explained above, when I is constant as Vbs=0 in Equation 1, f(Vgs, Vds) is a constant. Consequently, Equation 1 can be rewritten as Equation 3:

[Mathematical Formula 3]

$$Vgs=f_1(Vds) \quad (3)$$

That is, Vgs can be represented by function $f_1$ of Vds. Here, in order for Vgs to be constant, one Vds may be made constant. That is, in order to keep Vgs constant independent of gate voltage Vg as the input signal, Vds may be made constant. Consequently, when control

Figure 1:
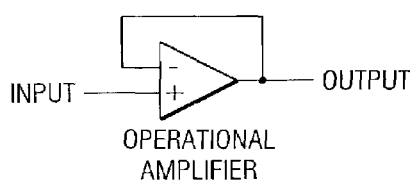
FIG. 1 is a circuit diagram illustrating a general structural example of a conventional closed loop buffer using an operational amplifier.
Figure 2:
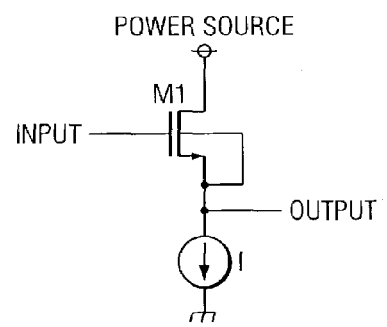
FIG. 2 is a circuit diagram illustrating the general structure of a conventional source follower type open loop buffer using NMOS transistor M1.

[Mathematical Formula 4]

$$Vds=f_2(Vgs) \quad (4)$$

is added to the source follower shown in FIG. 2, one has the following relationship.

$$Vgs=f_1(f_2(Vgs))=f3(Vgs) \quad (5)$$

Here, when Equation 5 is solved with respect to Vgs, one has

[Mathematical Formula 6]

$$Vgs = constant \quad (6)$$

As a result, assuming that Vds is a function of Vgs as shown in Equation 4, it is possible for gate-source voltage Vgs to be constant as shown in Equation 6.

Consequently, in this invention, function $f_2$ in Equation 4 is realized in control unit 30 shown in FIG. 7. Here, examples of function $f_2$ include a constant function, linear function, and a function as a combination of said linear function and constant function. That is, for $f_2$, one may have constant function $f_2 = k$ (where k is a constant), linear function $f_2 = x$ (where $x = Vgs$), or a combination of a linear function and constant function $f_2 = x + k$. Also, in appropriate cases, $f_2$ may be any other function.

In the following, with reference to FIGS. 8-13, embodiments of a buffer circuit that contains the Early effect component reducing circuit of this invention will be considered.

Figure 8:
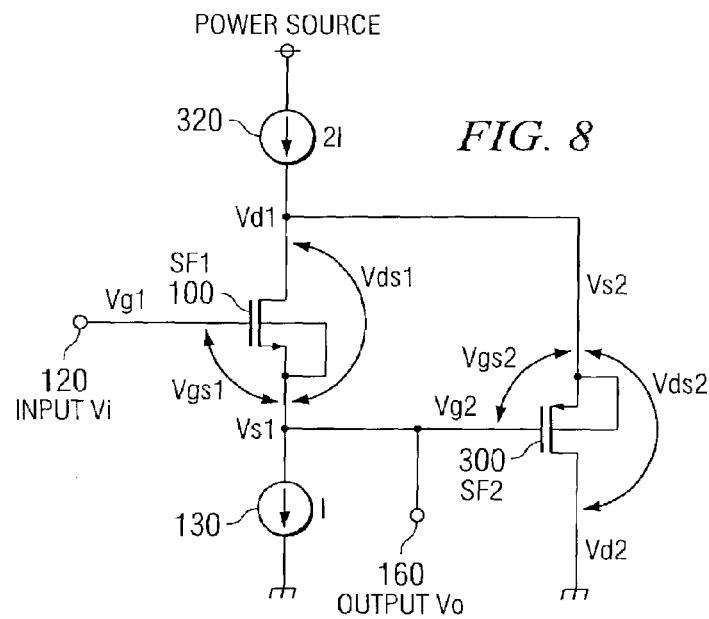
FIG. 8 is a circuit diagram illustrating an embodiment of the buffer circuit of this invention with constant function as function $f_2$ used in reducing the Early effect component.
Figure 9:
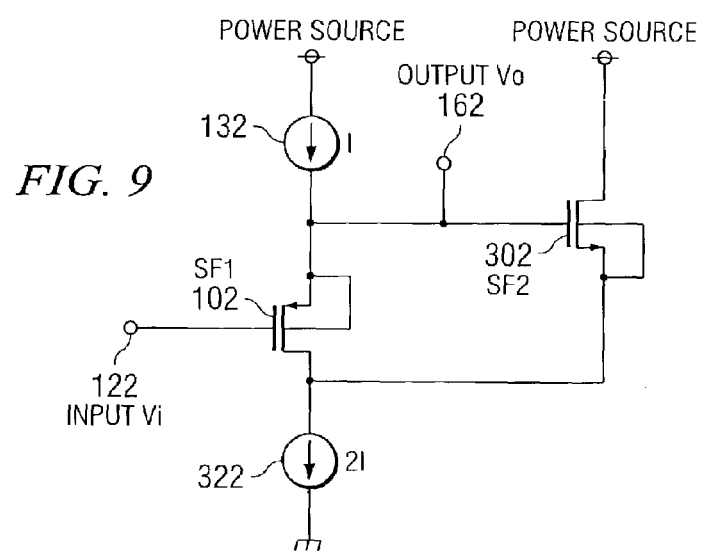
FIG. 9 is a circuit diagram illustrating an embodiment of the buffer circuit of this invention, with an electroconductive type of three-terminal device opposite that shown in FIG. 8.

The buffer circuit shown in FIGS. 8 and 9 is an embodiment when function $f_2$ used in reducing the Early effect component is a constant function. FIG. 8 illustrates an N-type circuit for the FET used as three-terminal device 10, and FIG. 9 illustrates the case of a P-type circuit. First of all, for the buffer circuit shown in FIG. 8, PMOS source follower SF2 that includes P-type MOSFET 300 is added to principal NMOS source follower SF1 containing N-type MOSFET 100, and the drain of FET 100 is clamped to the output level of FET 300. In this case, as control unit 30 shown in FIG. 7, a device of the same type as three-terminal device 10 is used. More specifically, said buffer circuit contains N-type MOSFET 100, which has its gate connected to input terminal 120, its source connected to ground via constant-current source 130 having constant current I flowing in it, and its source also connected to output terminal 160. Also, the body electrode is connected to the source terminal. Due to this connection, principal source follower SF1 is formed. Also, this buffer circuit has P-type MOSFET 300. Its gate is connected to the source of FET 100, its drain is connected to ground, and its source is connected to the power source terminal via constant-current source 320 having constant current 2I flowing in it, and, at the same time, it is also connected to the drain of FET 100. Also, the body electrode of said FET 300 is connected to the source. With this connection, source follower SF2 of said added PMOS is formed. The magnitude of constant-current source 320 of PMOS source follower SF2 is taken as 2I so that the maximum value of the output source current and that of the output sink current of principal NMOS source follower SF1 become current I. As a result, at steady state, constant current I between drain and source in FET 100 is equal to that in FET 300.

FIG. 6 illustrates voltages of the various portions in the buffer circuit of this invention with the aforementioned constitution. More specifically, source voltage Vs1 of FET 100 is lower than gate voltage Vg1 as the input signal by gate-source voltage Vgs1. For FET 300 for which source voltage Vs1 of FET 100 becomes gate voltage Vg2, its source voltage Vs2 is higher than gate voltage Vg2 by gate-source voltage Vgs2, and its source voltage Vs2 becomes drain voltage Vd1 of FET 100. Also, the drain terminal of FET 300 is connected to ground. As a result, drain-source voltage Vds1 of FET 100 is equal to gate-source voltage Vgs2 (Vds1 = Vgs2). In this case, in FET 300, since constant current I (=2I−I) flows between drain and source, even when drain-source voltage Vds2 is not constant, because λ is small as can be seen in Equation 2, as a first approximation, gate-source voltage Vgs2 of FET 300 is almost constant. Consequently, drain-source voltage Vds1 of FET 100 is also essentially constant. In this way, as shown in the waveform diagram of FIG. 6, due to essentially constant Vds1, the drain voltage of FET 100 (Vd' in FIG. 6) moves in synchronization with gate voltage Vg (Vg in FIG. 6) as the level of input signal. Consequently, drain-source voltage Vds of FET 100 is almost constant independent of the input signal level. Consequently, it is possible to reduce the Early effect component significantly in Equation 2. In this embodiment, Vds1 = Vgs2 = constant. Consequently, as can be seen from said Equation 4, a constant relationship as function $f_2$ for reducing the Early effect component is obtained.

In summary, in the buffer circuit shown in FIG. 8, by using a construction based on intrinsically high-speed source follower SF1, a drain that was formerly a ground node is not grounded, and it follows the voltage level in synchronization with the input signal. As a result, the drain-source voltage of the transistor is always kept constant. Consequently, the dependence of the gate-source voltage on the input signal level is suppressed significantly, and a high-speed buffer with small gain error and harmonic distortion is obtained.

FIG. 9 illustrates an embodiment of a buffer circuit that has an electroconductive type opposite that of the three-terminal device in FIG. 8. It is composed of source follower SF1 of a PMOS equipped with P-type MOSFET 102 and constant-current source 132, and added source follower SF2 equipped with N-type MOSFET 302 and constant-current source 322. This buffer circuit operates in the same way as the buffer circuit in FIG. 8, except that the polarity of the three-terminal device is opposite that in FIG. 8. Consequently, it will not be explained in detail. In addition, in this example, just as the circuit shown in FIG. 8, function $f_2$ of a constant function is realized. As a result, it is possible to realize significant reduction of the Early effect component.

Figure 10:
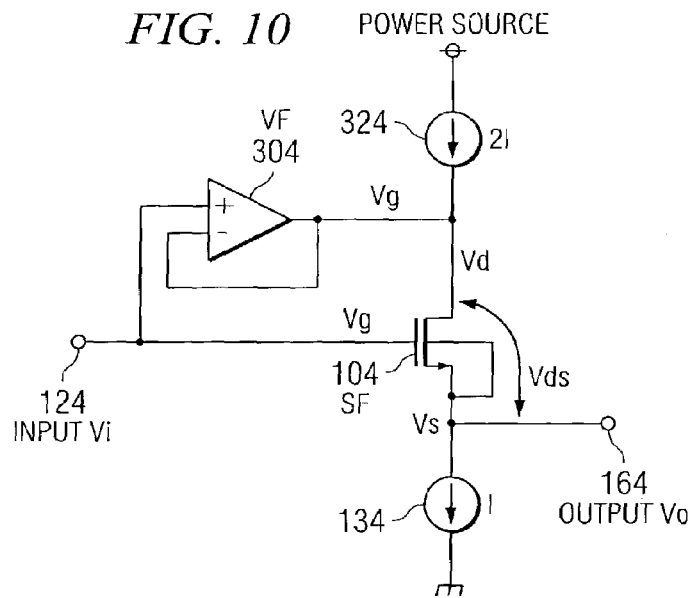
FIG. 10 is a circuit diagram illustrating an embodiment of the buffer circuit of this invention with linear function as function $f_2$ used in reducing the Early effect component.
Figure 11:
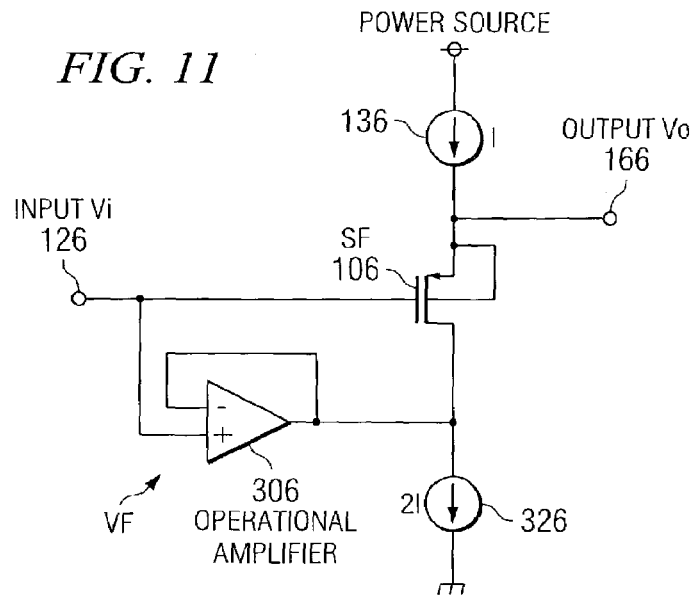
FIG. 11 is a circuit diagram illustrating an embodiment of the buffer circuit of this invention with an electroconductive type of three-terminal device opposite that shown in FIG. 10.

The buffer circuits shown in FIGS. 10 and 11 refer to embodiments when function $f_2$ used in reducing the Early effect component is a linear function. FIG. 10 shows an N-type circuit of a FET used as three-terminal device 10. On the other hand, FIG. 11 illustrates the case of a P-type circuit. First of all, the buffer circuit shown in FIG. 10 is an example of synchronization of the drain of FET 104 of the source follower with the input signal level using voltage follower VF with respect to NMOS source follower SF that contains N-type MOSFET 104. In this case, as control unit 30 shown in FIG. 7, a device or circuit different from three-terminal device 10 is used. That is, this buffer circuit contains N-type MOSFET 104. The gate is connected to input terminal 124, the source is connected to ground via constant-current source 134 having constant current I flowing in it, and the source is connected to output terminal 164. Also, the body electrode is connected to the source terminal. Due to this connection, source follower SF is formed. Also, the buffer circuit has operational amplifier 304. For this operational amplifier, the non-inverted input is connected to input terminal 124, the output terminal is connected to the power source terminal via constant-current source 324 of 2I, and it is also connected to the drain of FET 104. Also, the output terminal of operational amplifier 304 is connected to its inverted input. By means of this connection, voltage follower VF is made from operational amplifier 304. Based on the same reasoning as that of the circuit shown in FIG. 8, the magnitude of constant-current source 324 on the drain side is 2I.

For the operation of this buffer circuit, in the static state, voltage follower VF sinks current I. In this case, because the potential difference between the inverted input and the non-inverted input of operational amplifier 304 is zero, the potential of the output terminal of operational amplifier 304 becomes equal to the potential of input terminal 124, that is, gate voltage Vg of FET 104. As a result, drain voltage Vd of FET 104 is equal to gate voltage Vg (Vd=Vg), drain-source voltage Vds becomes equal to gate-source voltage Vgs (Vds=Vgs). Here, assuming that Vgs is essentially constant, Vds is also essentially constant. Consequently, just as with the circuit shown in FIG. 8, the drain voltage (Vd' in FIG. 6) of FET 104 varies in synchronization with gate voltage Vg as the level of the input signal (Vg in FIG. 6). Consequently, drain-source voltage Vds of FET 104 is almost constant independent of the input signal level, and the Early effect component can be reduced significantly. In this embodiment, Vds=Vgs, and Vds varies as a function of Vgs. Consequently, as can be seen from said Equation 4, a linear function relationship with function $f_2$ for reducing the Early effect component is obtained.

If the buffer circuit shown in FIG. 10 is compared with the buffer circuit shown in FIGS. 8 and 9, the response speed of voltage follower VF shown in FIG. 10 itself is lower than added source follower SF shown in FIGS. 8 and 9. However, settling of the drain voltage level of the principal source follower has little influence on settling of the final output at output terminal 164. When, for example, the buffer circuit of this invention is a mixed signal circuit of an analog-digital converter or digital-analog converter, assuming that settling of the final output has a 12-bit precision, settling of the drain voltage level, such as the drain of FET 104, may be about 6-8 bits. Consequently, when operational amplifier 304 of voltage follower VF has a relatively high speed, a sufficiently high speed of operation can be realized even for the buffer circuit constitution shown in FIG. 10.

FIG. 11 is a diagram illustrating an embodiment of a buffer circuit having an electroconductivity opposite that of three-terminal device shown in FIG. 10. It is formed of principal PMOS source follower SF equipped with P-type MOSFET 106 and constant-current source 136, and a voltage follower equipped with operational amplifier 306. Here, as control unit 30 in FIG. 7, a device or circuit different from three-terminal device 10 is used. This buffer circuit operates in the same way as the buffer circuit shown in FIG. 10, except that the polarity of the three-terminal device is opposite that shown in FIG. 10. Consequently, no detailed explanation will be made for it. Also, in this example, just as with the circuit shown in FIG. 10, function $f_2$ of a linear function is realized. As a result, the Early effect component can be reduced significantly.

Figure 12:
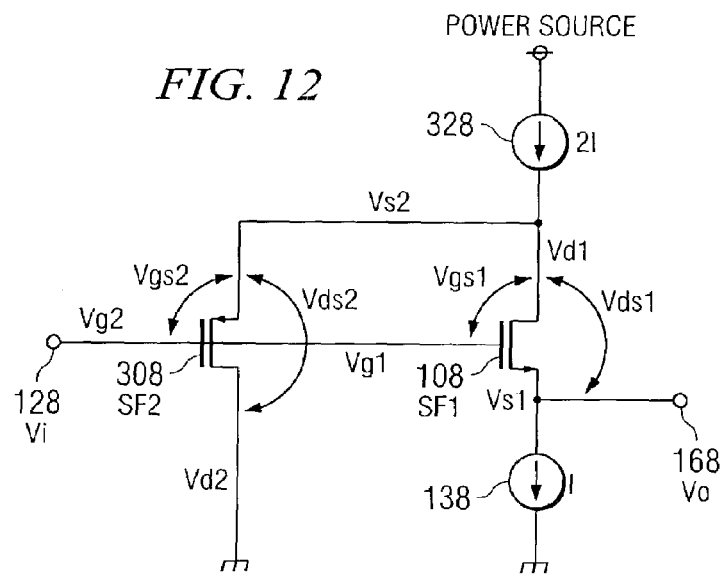
FIG. 12 is a circuit diagram illustrating an embodiment of the buffer circuit of this invention with a combination of linear function and constant function as function $f_2$ used in reducing the Early effect component.
Figure 13:
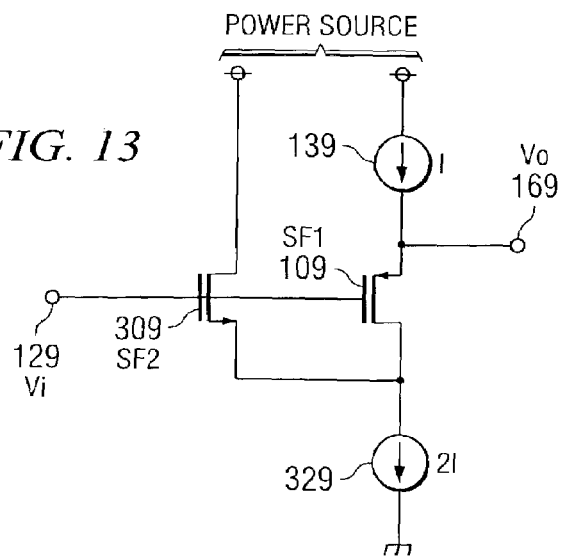
FIG. 13 is a circuit diagram illustrating an embodiment of the buffer circuit of this invention with an electroconductive type of three-terminal device opposite that shown in FIG. 12.

In the following, with reference to FIGS. 12 and 13, examples will be considered of buffer circuits when function $f_2$ used in reducing the Early effect component is a combination of a linear function and a constant function. FIG. 12 is a diagram illustrating an N-type circuit of a FET used as three-terminal device 10. FIG. 13 illustrates a P-type circuit.

First of all, for the buffer circuit shown in FIG. 12, PMOS source follower SF2 containing P-type MOSFET 308 is added to principal NMOS source follower SF1 containing N-type MOSFET 108, and the drain of FET 108 is clamped to the output level of FET 308. More specifically, this buffer circuit contains N-type MOSFET 108, which has its gate connected to input terminal 128, its source connected to ground via constant-current source 138 with constant current I flowing in it, and its source also connected to output terminal 168. Also, its body electrode is connected to the source terminal. Due to this connection, principal source follower SF1 is formed. Also, this buffer circuit has P-type MOSFET 308. Just as FET 108, this FET has its gate connected to input terminal 128, its drain connected to ground, and its source connected to the power source terminal via constant-current source 328 with constant current 2I flowing in it, and also connected to the drain of FET 108. Also, the body electrode of FET 308 is connected to the source. Due to this connection, source follower SF2 of said added PMOS is formed. Also, just as in FIGS. 8 and 9, the magnitude of constant-current source 328 of PMOS source follower SF2 is 2I, so that both the maximum level of the output source current of principal NMOS source follower SF1 and that of the output sink current become current I.

For the buffer circuit of this invention having the aforementioned constitution, voltages of the various portions are shown in FIG. 6. More specifically, source voltage Vs1 is lower than gate voltage Vg1 as input signal Vi by gate-source voltage Vgs1, and it becomes output voltage Vo. For FET 308 with its gate voltage Vg2 equal to gate voltage Vg1 of FET 108, its source voltage Vs2 is higher than gate voltage Vg2 by gate-source voltage Vgs2, and this source voltage Vs2 becomes drain voltage Vd1 of FET 108. Also, the drain terminal of FET 308 is connected to ground. As a result, drain-source voltage Vds1 of FET 108 becomes equal to the sum of gate-source voltage Vgs2 of FET 308 and gate-source voltage Vgs1 of FET 108 (Vds1=Vgs1+Vgs2). In this case, just as shown in FIG. 8, for FET 308, since a constant current I (=2I−I) flows between drain and source, even when drain-source voltage Vds2 is not constant, Vgs2 is still almost constant to a first approximation. Consequently, for FET 108, drain-source voltage Vds1=Vgs1+Const, and function f2 is a combination of a linear function and a constant function. Consequently, Vgs1 is essentially constant, and Vds1 is essentially constant. As shown in the waveform diagram of FIG. 6, the drain voltage of FET 108 (Vd' in FIG. 6) varies in synchronization with gate voltage Vg (Vg in FIG. 6) as the level of input signal Vi. Consequently, drain-source voltage Vds1 of FET 108 is almost constant independent of input signal level Vi. As a result, it is possible to significantly reduce the Early effect component in Equation 2.

FIG. 13 is a diagram illustrating an embodiment of a buffer circuit with an electroconductivity opposite that of the three-terminal device in FIG. 12. It is formed of source follower SF1 of principal PMOS equipped with P-type MOSFET 109 and constant-current source 139, and added source follower SF2 equipped with N-type MOSFET 309 and constant-current source 329. This buffer circuit operates in the same way as the buffer circuit in FIG. 12, except that the polarity of the three-terminal device is opposite that in FIG. 12. Consequently, it will not be explained in detail. In addition, in this example, just as with the circuit shown in FIG. 12, function $f_2$ of (linear function+constant function) is realized. As a result, it is possible to realize significant reduction of the Early effect component.

Characteristics of the buffer circuits described above with reference to FIGS. 8-13 will be considered. When an example, in which source follower SF with opposite polarity is used in an added circuit, is compared with an embodiment, in which voltage follower VF is used, usually, the former has higher speed, while the latter has higher precision.

In the following, a comparison is made between the results of simulation of a buffer circuit of the prior art in FIG. 3 and those of the buffer circuits shown in FIGS. 9 and 11.

TABLE 1

Figure 3:
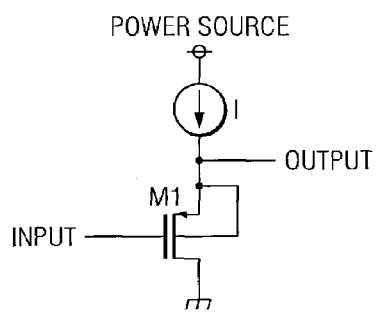
FIG. 3 is a circuit diagram illustrating the general structure of a conventional source follower type open loop buffer using PMOS transistor M1.

|  | Example of FIG. 3 | Example of FIG. 9 | Example of FIG. 11 |
|---|---|---|---|
| Settling time (rise) | 5.96 ns | 4.97 ns | 4.75 ns |
| Settling time (fall) | 5.95 ns | 6.29 ns | 4.83 ns |
| Gain error | −2.25% | −0.5% | 0.05% or lower |

TABLE 1-continued

|  | Example of FIG. 3 | Example of FIG. 9 | Example of FIG. 11 |
| --- | --- | --- | --- |
| Total harmonic distortion (THD) | −75.7 dB | −77.5 dB | −81.1 dB |

As can be seen from the above listed table, for the settling time, it is possible to realize about the same high-speed operation as the prior art. In addition, the gain error of this invention can be reduced up to two orders of magnitude below that of the prior art. The total harmonic distortion of this invention is about 2-6 dB higher than that of the prior art. However, the buffer circuit of this invention has a higher power consumption due to the added circuit.

In the above, examples of this invention have been explained. However, various modifications can be made. First of all, while this invention has been explained with reference to examples using a FET, this invention also applies to circuits using bipolar transistors, and the same results can be obtained. In this case, one may use a collector-grounded emitter follower in place of the source follower. Also, bipolar transistors with either an NPN electroconductive type or PNP electroconductive type may be used. Second, in the aforementioned embodiments, high speed and high precision of operation of signal processing circuit 1 are taken as the target of reduction for the influence of the Early effect. However, this invention also applies to reaching other desired targets. Third, in the aforementioned examples, the buffer circuit has merely a single stage 1. However, as needed, it is also possible to form a buffer circuit from plural sections of said buffer circuit. Fourth, the buffer circuit of this invention is not limited to analog circuits; it may also be used in mixed signal circuits.

As explained in detail above, according to this invention, it is possible to have higher performance, such as high operation speed and higher precision, for operation of a circuit containing a three-terminal device. Also, influence of the Early effect can be reduced simply by reducing the Early effect component in the circuit operation. In addition, for a buffer circuit using this invention, the settling time of the buffer operation can be further shortened below that in the prior art, and it is possible to realize high-precision buffer operation with even smaller error and distortion.

The invention claimed is:

1. A source-follower, comprising:
a field effect transistor (FET) with a source connected to a first current source, a drain connected to a second current source, and a gate connected to an in put, wherein the second current source is at least twice as large as first current source; and
an Early-effect-reduction circuit connected to the drain and to the source, the Early-effect-reduction circuit operable to maintain a drain-source voltage constant by withdrawal of current at the drain, wherein the Early-effect-reduction circuit includes an amplifier circuit with an input connected to the gate and output connected to the drain.

2. The source-follower of claim 1, wherein the Early-effect-reduction circuit is a second FET with a second gate connected to the source and a second source connected to the drain.

3. The source-follower of claim 2, wherein the FET is NMOS and the second field effect transistor is PMOS.

4. A source-follower, comprising:
a field effect transistor with a source connected to a first current source, a drain connected to a second current source, and a gate connected to an in put, wherein the second current source is at least twice as large as first current source; and
an Early-effect-reduction circuit connected to the drain and to the gate, the Early-effect-reduction circuit including an opamp, and the Early-effect-reduction circuit being operable to maintain a drain-source voltage constant by withdrawal of current at the drain, wherein the opamp having feedback, an input connected to the gate, and output connected to the drain.

5. The source-follower of claim 4, wherein the FET is an NMOS FET.

* * * * *

UNITED STATES PATENT AND TRADEMARK OFFICE
CERTIFICATE OF CORRECTION

PATENT NO. : 7,576,594 B2
APPLICATION NO. : 10/270746
DATED : August 18, 2009
INVENTOR(S) : Shozo Nitta It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 26 days.

Signed and Sealed this

Seventh Day of September, 2010

David J. Kappos
*Director of the United States Patent and Trademark Office*